(12) United States Patent
Chen et al.

(10) Patent No.: US 10,163,800 B2
(45) Date of Patent: Dec. 25, 2018

(54) PACKAGE STRUCTURE WITH DUMMY FEATURE IN PASSIVATION LAYER

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 7 days.

(21) Appl. No.: 15/205,229

(22) Filed: Jul. 8, 2016

(65) Prior Publication Data

US 2018/0012843 A1  Jan. 11, 2018

(51) Int. Cl.
| | |
|---|---|
| *H01L 23/00* | (2006.01) |
| *H01L 23/48* | (2006.01) |
| *H01L 23/52* | (2006.01) |
| *H01L 23/538* | (2006.01) |
| *H01L 23/31* | (2006.01) |

(52) U.S. Cl.
CPC ...... *H01L 23/5386* (2013.01); *H01L 23/3157* (2013.01); *H01L 23/5384* (2013.01); *H01L 23/5389* (2013.01); *H01L 23/3128* (2013.01); *H01L 23/5385* (2013.01); *H01L 2224/16225* (2013.01); *H01L 2224/48091* (2013.01); *H01L 2224/73204* (2013.01); *H01L 2924/15311* (2013.01); *H01L 2924/181* (2013.01)

(58) Field of Classification Search
CPC ............. H01L 23/5386; H01L 23/5384; H01L 23/5389; H01L 2225/06513; H01L 2225/06589; H01L 23/367; H01L 23/3157; H01L 2224/73204; H01L 2224/16225; H01L 2224/48091; H01L 2924/181; H01L 23/5385; H01L 2924/15311; H01L 23/3128
USPC .................................................. 257/663–673
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |

(Continued)

*Primary Examiner* — Marcos D Pizarro
*Assistant Examiner* — Nelson Garces
(74) *Attorney, Agent, or Firm* — Birch, Stewart, Kolasch & Birch, LLP (57) ABSTRACT

Package structures are provided. The package structure includes an integrated circuit die. The package structure also includes a package layer surrounding the integrated circuit die. There is an interface between the integrated circuit die and the package layer. The package structure further includes a redistribution structure below the integrated circuit die and the package layer. The redistribution structure includes active conductive lines electrically connected to the integrated circuit die. The redistribution structure also includes a dummy conductive line between the active conductive lines. The dummy conductive line extends across the interface.

20 Claims, 6 Drawing Sheets

(56) References Cited

U.S. PATENT DOCUMENTS

| | | |
|---|---|---|
| 8,877,554 B2 | 11/2014 | Tsai et al. |
| 2011/0198749 A1* | 8/2011 | Lee .................... H01L 23/49816 |
| | | 257/737 |
| 2011/0291288 A1 | 12/2011 | Wu et al. |
| 2012/0298410 A1* | 11/2012 | Lu ........................... H01L 22/32 |
| | | 174/264 |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0130070 A1* | 5/2015 | Lin ....................... H01L 23/481 |
| | | 257/774 |

* cited by examiner

PACKAGE STRUCTURE WITH DUMMY FEATURE IN PASSIVATION LAYER

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate. Many integrated circuits are typically manufactured on a single semiconductor wafer, and individual dies on the wafer are singulated by sawing between the integrated circuits along a scribe line. The individual dies are typically packaged separately, in multichip modules, for example, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes less area or a smaller height, in some applications.

New packaging technologies, such as package on package (PoP), have begun to be developed, in which a top package with a device die is bonded to a bottom package, with another device die. By adopting the new packaging technologies, various packages with different or similar functions are integrated together. These relatively new types of packaging technologies for semiconductor devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
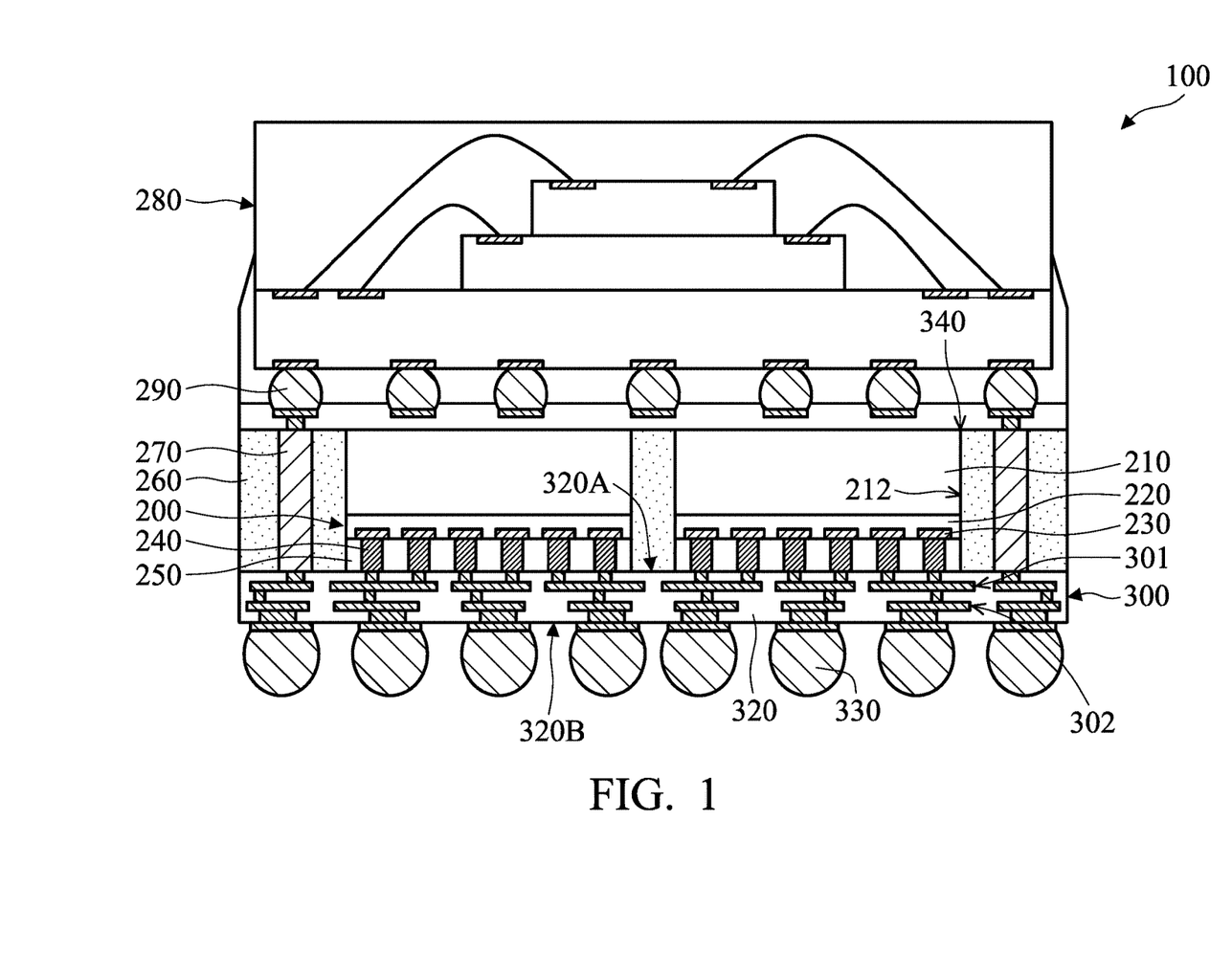
FIG. 1 is a cross-sectional view of a package structure, in accordance with some embodiments.
Figure 2:
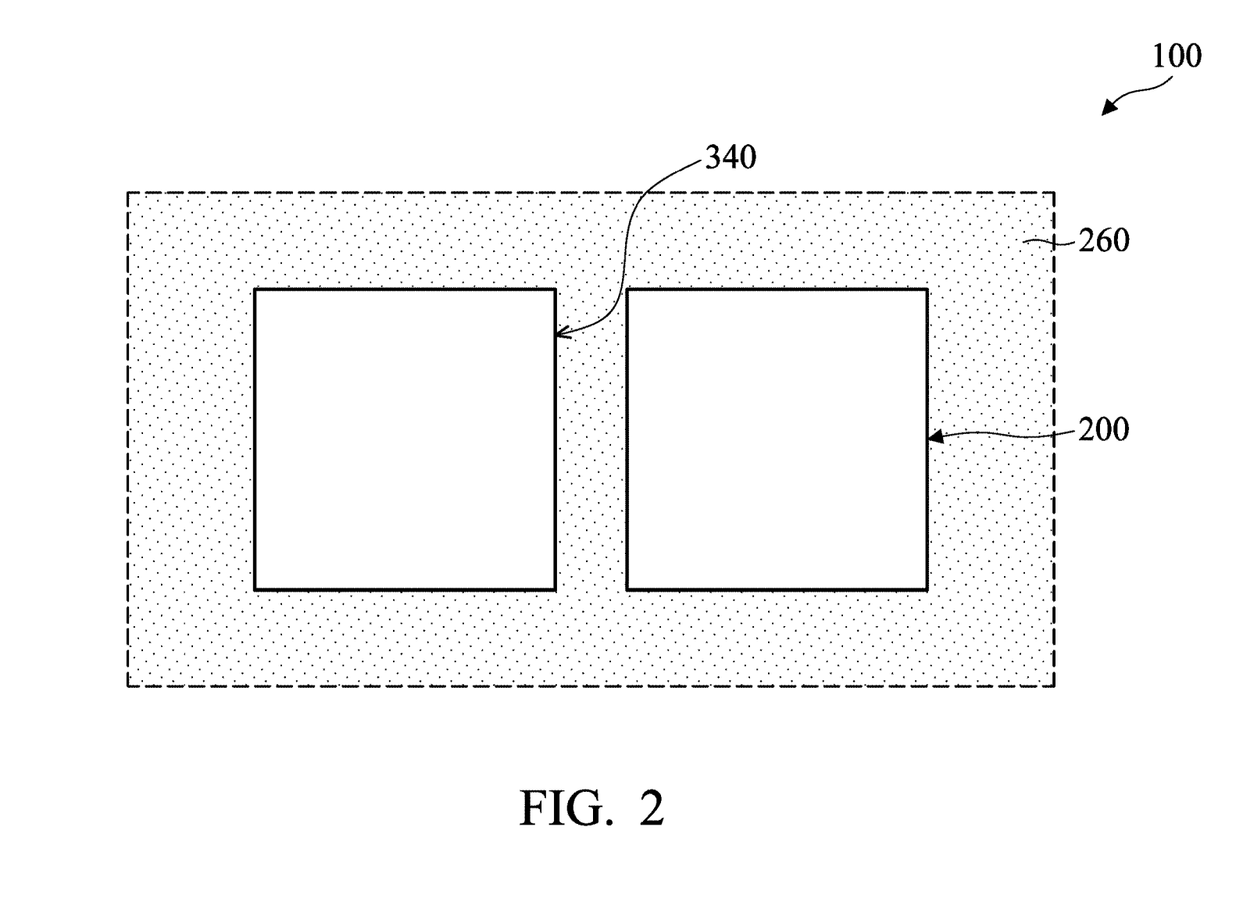
FIG. 2 is a top view of a package structure, in accordance with some embodiments.

Some embodiments for a package structure are described. FIG. 1 is a cross-sectional view of a package structure, in accordance with some embodiments. FIG. 2 is a top view of a package structure, in accordance with some embodiments. Additional features can be added to the package structure. Some of the features described below can be replaced or eliminated for different embodiments.

As shown in FIG. 1, a package structure 100 includes multiple integrated circuit dies 200, in accordance with some embodiments. The integrated circuit dies 200 may be device dies including transistors, diodes, or another suitable integrated circuit element. The device dies may also include capacitors, inductors, resistors, another integrated circuit element, or a combination thereof. In some embodiments, the integrated circuit dies 200 are sensor dies, logic dies, central processing unit (CPU) dies, memory dies, or another suitable dies.

Each of the integrated circuit dies 200 may include a semiconductor substrate 210, a passivation layer 220, conductive pads 230, connectors 240, and a protection layer 250. In some embodiments, the semiconductor substrate 210 includes silicon or another elementary semiconductor material such as germanium. In some other embodiments, the semiconductor substrate 210 includes a compound semiconductor. The compound semiconductor may include silicon germanium, gallium arsenide, silicon carbide, another suitable compound semiconductor, or a combination thereof.

A variety of device elements may be formed in or over the semiconductor substrate 210. The device elements include active devices and/or passive devices. The passivation layer 220 is connected to the semiconductor substrate 210. The conductive pads 230 are in the passivation layer 220 and electrically connected to the device elements. The protection layer 250 is connected to the passivation layer 220. The connectors 240 are embedded in the protection layer 250 and electrically connected to the conductive pads 230.

Although FIG. 1 shows that the package structure 100 includes multiple integrated circuit dies 200, embodiments of the disclosure are not limited thereto. In some other embodiments, the package structure 100 includes one integrated circuit die 200.

As shown in FIGS. 1 and 2, the integrated circuit dies 200 are surrounded by a package layer 260, in accordance with some embodiments. There is an interface 340 between the package layer 260 and each of the integrated circuit dies 200, as shown in FIG. 2. In some embodiments, the semiconductor substrate 210, the passivation layer 220, and the protection layer 250 are embedded in the package layer 260.

In some embodiments, the semiconductor substrate 210 has a boundary 212 in direct contact with the package layer 260. The boundary 212 is substantially coplanar with the interface 340 between the package layer 260 and the integrated circuit dies 200.

In some embodiments, the package layer 260 includes a polymer material. In some embodiments, the package layer 260 includes a molding compound. The material of the package layer 260 is different from the material of the semiconductor substrate 210. In some embodiments, the material of the package layer 260 is different from the material of the passivation layer 220 and/or the protection layer 250.

The package layer 260 further surrounds multiple conductive features 270, as shown in FIG. 1 in accordance with some embodiments. In some embodiments, the conductive features 270 are on two opposite sides of the integrated circuit dies 200. In some other embodiments, the conductive features 270 discontinuously surround the integrated circuit dies 200.

In some embodiments, the conductive features 270 are conductive pillars or other suitable structures. The conductive features 270 may be referred to as through interposer vias (TIVs). In some embodiments, the conductive features 270 include Cu, Al, nickel (Ni), platinum (Pt), lead-free solder (e.g., SnAg, SnCu, SnAgCu), another suitable conductive material, or a combination thereof.

Many variations and/or modifications can be made to embodiments of the disclosure. In some other embodiments, the package structure 100 does not include the conductive features 270.

As shown in FIG. 1, the package structure 100 also includes a redistribution structure 300 below the integrated circuit dies 200 and the package layer 260, in accordance with some embodiments. The redistribution structure 300 is electrically connected to the connectors 240 of the integrated circuit dies 200 and the conductive features 270. In some embodiments, the front side (the active surface) of the integrated circuit dies 200 faces the redistribution structure 300. Embodiments of the disclosure are not limited thereto. In some other embodiments, the back side (the non-active surface) of the integrated circuit dies 200 faces the redistribution structure 300.

The redistribution structure 300 includes one or more conductive layers and one or more passivation layers. For example, the redistribution structure 300 includes conductive layers 301 and 302 in a passivation layer 320. The passivation layer 320 has a top surface 320A and a bottom surface 320B. The top surface 320A is nearer the integrated circuit dies 200 than the bottom surface 320B. In some embodiments, the top surface 320A is in direct contact with the package layer 260. The passivation layer 320 may include multiple sub-layers.

In some embodiments, the passivation layer 320 is made of polybenzoxazole (PBO), benzocyclobutene (BCB), silicone, acrylates, siloxane, another suitable material, or a combination thereof. In some other embodiments, the passivation layer 320 in the redistribution structure 300 is made of non-organic materials. The non-organic materials includes silicon oxide, un-doped silicate glass, silicon oxynitride, solder resist (SR), silicon nitride, silicon carbide, hexamethyldisilazane (HMDS), another suitable material, or a combination thereof.

The conductive layers 301 and 302 are at different levels of the redistribution structure 300. The conductive layer 301 is closer to the top surface 320A of the passivation layer 320 than the conductive layer 302. In some embodiments, the conductive layer 301 is the topmost conductive layer in the redistribution structure 300. In some embodiments, there are dummy features, which will be described in more detail later, in the passivation layer 320 and at a substantial same level as the conductive layer 301.

In some embodiments, the conductive layers 301 and 302 are made of a metal material. The metal material includes copper (Cu), Cu alloy, aluminum (Al), Al alloy, tungsten (W), W alloy, titanium (Ti), Ti alloy, tantalum (Ta), Ta alloy, another suitable material, or a combination thereof.

As shown in FIG. 1, an element 280 is stacked over the integrated circuit dies 200, in accordance with some embodiments. The element 280 and the redistribution structure 300 are on two opposite sides of the integrated circuit dies 200. The element 280 is electrically connected to the integrated circuit dies 200 through the conductive features 270 and the redistribution structure 300.

In some embodiments, the element 280 includes a package structure that contains one or more integrated circuit dies. The package structure may be a memory package or another suitable package. However, embodiments of the disclosure are not limited thereto. In some other embodiments, the element 280 includes an integrated circuit die. The element 280 can be varied according to requirements.

In some embodiments, one or more connectors 290 are used to bond the element 280 over the integrated circuit dies 200, as shown in FIG. 1. The connectors 290 include solder bumps, metal pillars, other suitable connectors, or a combination thereof.

Although FIG. 1 shows that there is one element 280 over the integrated circuit dies 200, embodiments of the disclosure are not limited thereto. In some other embodiments, there are multiple elements 280 over the integrated circuit dies 200.

Many variations and/or modifications can be made to embodiments of the disclosure. In some other embodiments, the package structure 100 does not include the element 280 and the connectors 290.

The package structure 100 further includes multiple connectors 330 below the redistribution structure 300, as shown in FIG. 1 in accordance with some embodiments. The connectors 330 and the integrated circuit dies 200 are on two opposite sides of the redistribution structure 300. The connectors 330 are electrically connected to the integrated circuit dies 200 through the redistribution structure 300. In some embodiments, the connectors 330 include solder bumps, metal pillars, other suitable connectors, or a combination thereof.

In some embodiments, the package structure 100 shown in FIG. 1 is further bonded to a substrate through the connectors 330. The substrate is a printed circuit board, another package structure, or another suitable substrate.

Figure 3:
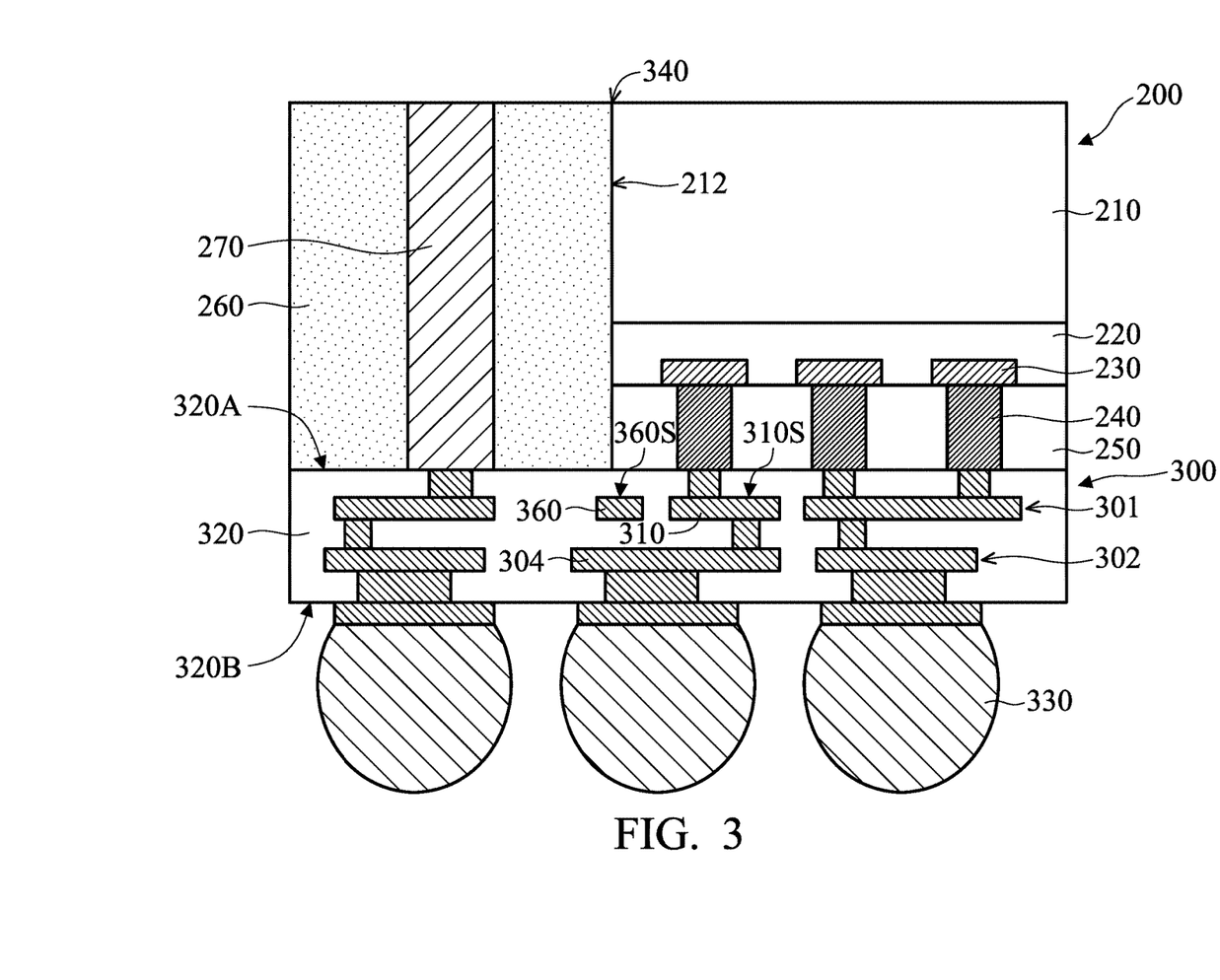
FIG. 3 is an enlarged cross-sectional view of a package structure, in accordance with some embodiments.
Figure 4:
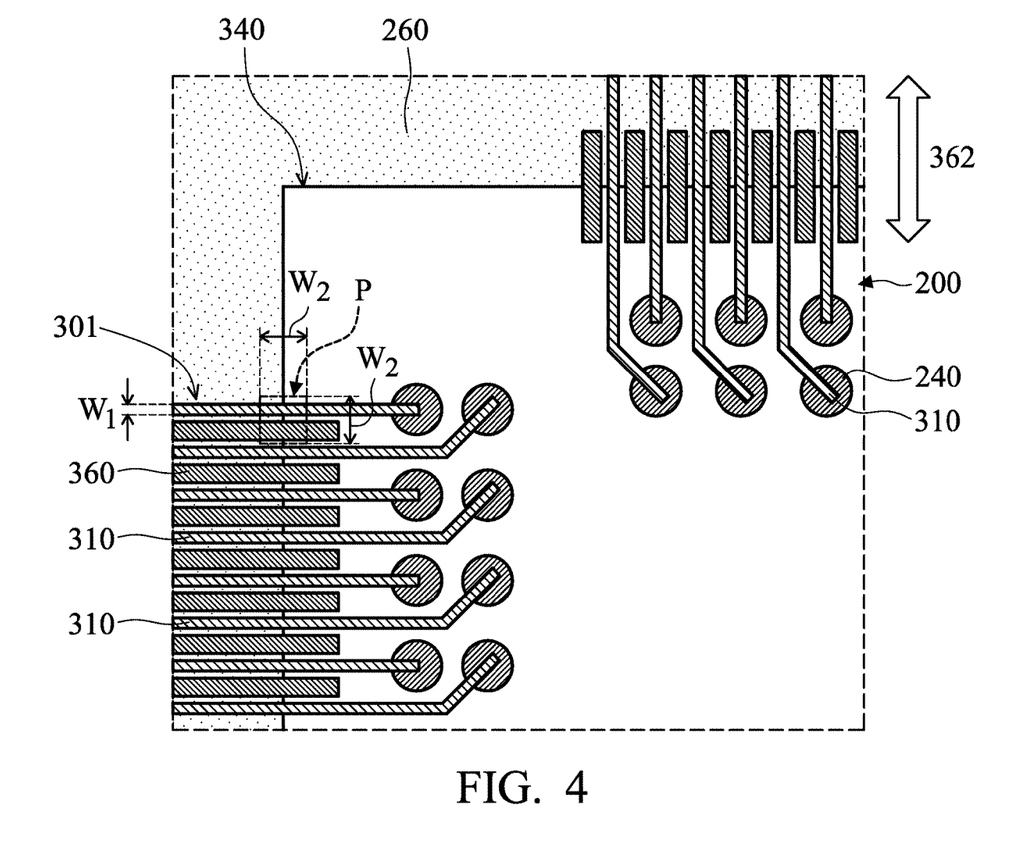
FIG. 4 is an enlarged top view of a package structure, in accordance with some embodiments.

FIG. 3 is an enlarged cross-sectional view of a package structure, in accordance with some embodiments. FIG. 4 is an enlarged top view of a package structure, in accordance with some embodiments. In some embodiments, FIGS. 3 and 4 show a portion of the package structure 100 shown in FIG. 1.

As shown in FIGS. 3 and 4, the conductive layer 301 in the passivation layer 320 includes multiple active conductive lines 310, in accordance with some embodiments. The active conductive lines 310 are electrically connected to the integrated circuit die 200. The active conductive lines 310 are also referred to as active redistribution line.

As shown in FIG. 3, the top surface 320A of the passivation layer 320 is closer to the active conductive lines 310 of the conductive layer 301 than the bottom surface 320B of the passivation layer 320. In some embodiments, the active conductive lines 310 are topmost redistribution lines of the redistribution structure 300.

In some embodiments, one of the active conductive lines 310 partially overlaps one of the connectors 240 and laterally extends across the interface 340 between the package layer 260 and the integrated circuit dies 200, as shown in FIG. 4. In some embodiments, the active conductive lines 310 partially overlap the interface 340 and extend along a direction 362 intersecting the interface 340.

In some embodiments, the width $W_1$ of the active conductive lines 310 is in a range from about 1 μm to about 50 μm. In some embodiments, the width $W_1$ is in a range from about 1 μm to about 20 μm. In some embodiments, the active conductive lines 310 are made of Cu, Al, W, Ti, Ta, another suitable material, or a combination thereof.

As shown in FIG. 3, there are dummy features 360 in the passivation layer 320, in accordance with some embodiments. The dummy features 360 are electrically insulated from the active conductive lines 310 and the integrated circuit die 200. In some embodiments, each of the dummy features 360 is a continuous line. The dummy features 360 are also referred to as dummy redistribution line.

As shown in FIG. 3, the dummy features 360 are under the interface 340 between the package layer 260 and the integrated circuit dies 200, in accordance with some embodiments. The top surface 320A of the passivation layer 320 is closer to the dummy features 360 than the bottom surface 320B of the passivation layer 320.

In some embodiments, the dummy features 360 and the active conductive lines 310 are positioned at a substantial same level. For example, the dummy features 360 and the active conductive lines 310 are included in the conductive layer 301. The dummy features 360 and the active conductive lines 310 are topmost redistribution lines of the redistribution structure 300. In some embodiments, the dummy features 360 have a top surface 360S that is substantially coplanar with a top surface 310S of the active conductive lines 310. In some embodiments, the dummy features 360 partially overlap one of active conductive lines 304 included in the conductive layer 302 below the conductive layer 301, as shown in FIG. 3.

Many variations and/or modifications can be made to embodiments of the disclosure. In some other embodiments, one or more of the dummy features 360 and the active conductive lines 310 are positioned at different levels. For example, one or more of the dummy features 360 are included in the conductive layer 302 below the conductive layer 301.

In some embodiments, the dummy features 360 do not extend under the connectors 240 and the conductive features 270. As a result, the connectors 240 vertically overlap one of the active conductive lines 310 without overlapping the dummy features 360. The conductive features 270 vertically overlap one of the active conductive lines 310 without overlapping the dummy features 360.

As shown in FIG. 4, the dummy features 360 partially overlap the interface 340 between the package layer 260 and the integrated circuit dies 200, in accordance with some embodiments. The dummy features 360 extend along the direction 362 intersecting the interface 340. As a result, the dummy features 360 extend across the interface 340. In some embodiments, multiple dummy features 360 are arranged along the interface 340, as shown in FIG. 4.

Although FIG. 4 shows that the dummy features 360 partially overlap both the integrated circuit dies 200 and the package layer 260, embodiments of the disclosure are not limited thereto. In some other embodiments, the dummy features 360 partially overlap the integrated circuit dies 200 or the package layer 260 without extending across the interface 340.

In some embodiments, one of the dummy features 360 is between the active conductive lines 310. In some embodiments, one of the active conductive lines 310 is between the dummy features 360. In some embodiments, one or more of the dummy features 360 are substantially parallel to one or more of the active conductive lines 310, as shown in FIG. 4. Many variations and/or modifications can be made to embodiments of the disclosure. In some other embodiments, one or more of the dummy features 360 are inclined to one or more of the active conductive lines 310.

As shown in FIG. 4, the dummy features 360 are continuous lines that are shorter than the active conductive lines 310, in accordance with some embodiments. In some embodiments, the dummy features 360 have a width that is greater than the width $W_1$ of the active conductive lines 310. Embodiments of the disclosure are not limited thereto. In some other embodiments, the width of the dummy features 360 is less than or substantially the same as the width $W_1$.

In some embodiments, one of the dummy features 360 and one of the active conductive lines 310 have different areas. The areas are taken along a plane parallel to the main surface of the integrated circuit dies 200. Although FIG. 4 shows that the area of one of the dummy features 360 is less than the area of one of the active conductive lines 310, embodiments of the disclosure are not limited thereto. In some other embodiments, the dummy features 360 and the active conductive lines 310 have substantially the same area as viewed from a top view.

In some embodiments, the dummy features 360 are made of a metal material. The metal material includes Cu, Al, W, Ti, Ta, another suitable material, or a combination thereof. In some embodiments, the dummy features 360 and the active conductive lines 310 are made of the same material.

Many variations and/or modifications can be made to embodiments of the disclosure. In some other embodiments, the dummy features 360 are made of a dielectric material. The dielectric material is different from the material of the passivation layer 320 in the redistribution structure 300.

According to some embodiments of the disclosure, there are dummy features 360 under the interface 340 between the package layer 260 and the integrated circuit dies 200. As a result, stress, which is caused by heterogeneous materials and is propagated from the interface 340 into the redistribution structure 300, is distributed. Damage to active conductive lines 310 in the redistribution structure 300 that may result from stress concentration is prevented. For example, the formation of cracks in the active conductive lines 310 is mitigated or eliminated. Therefore, reliability of the package structure is greatly improved.

In accordance with some embodiments, a ring region may be defined in the package structure 100. The ring region extends across the interface 340 and further extends along the interface 340 as viewed from a top view. In some embodiments, the distance between the boundary of the ring region and the interface 340 is in a range from about 50 μm to about 100 μm.

The redistribution structure 300 in the ring region has a portion P partially overlapping the interface 340, as shown in FIG. 4 in accordance with some embodiments. In some embodiments, the profile of the portion P is substantially square. The profile of the portion P is taken along a plane parallel to the main surface of the integrated circuit dies 200. In some embodiments, the width $W_2$ of the portion P is in a range from about 5 µm to about 100 µm. Embodiments of the disclosure are not limited. In some other embodiments, the portion P does not overlap the interface 340.

In some embodiments, the portion P of the redistribution structure 300 has an area ratio or a line density. The area ratio is defined as a ratio of the total area of the active conductive lines 310 and/or the dummy features 360 in the portion P to the area of the portion P. The areas are taken along a plane parallel to the main surface of the integrated circuit dies 200. In some embodiments, the area ratio or the line density of the portion P is in a range from about 40% to about 70%. Accordingly, it can be ensured that stress propagated from the interface 340 into the redistribution structure 300 is sufficiently distributed and diminished.

In some cases, the area ratio or the line density of the portion P should be substantially equal to or greater than about 40%. If the line density of the portion P is less than about 40%, stress propagated from the interface 340 into the redistribution structure 300 is concentrated. As a result, cracks may be formed in the active conductive lines in the redistribution structure 300. However, embodiments of the disclosure are not limited thereto. In some other cases, the line density of the portion P may be less than about 40%.

In some cases, the area ratio or the line density of the portion P should be substantially equal to or less than about 70%. If the line density of the portion P is greater than about 70%, some issues may be induced. For example, short circuits may be a concern when the number of conductive lines in the redistribution structure 300 is high. Also, it may be difficult to pattern or etch a conductive material to form the conductive lines in the redistribution structure 300. On the other hand, layout design of the conductive lines in the redistribution structure 300 may be limited when the width of the conductive lines is large. However, embodiments of the disclosure are not limited thereto. In some other cases, the line density of the portion P may be greater than about 70%.

Although FIG. 4 shows that the active conductive lines 310 have uniform width, embodiments of the disclosure are not limited thereto. In some other embodiments, one of the active conductive lines 310 has a greater width or has a wider part as viewed from a top view. As a result, the area ratio or the line density of the portion P is increased. Therefore, stress propagated from the interface 340 into the redistribution structure 300 is relieved even further. The wider part of the active conductive lines 310 may or may not extend across the interface 340 as viewed from a top view.

Figure 5A:
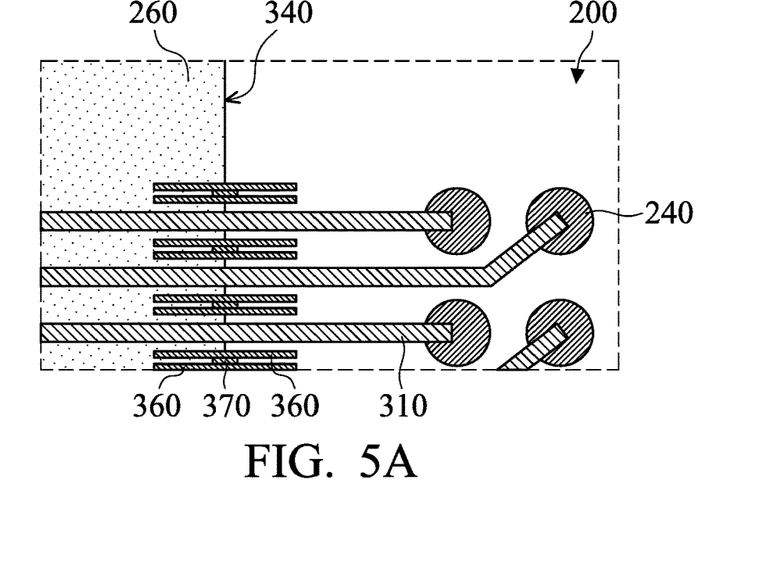
FIGS. 5A-5C are enlarged top views of a package structure, in accordance with some embodiments.
Figure 5B:
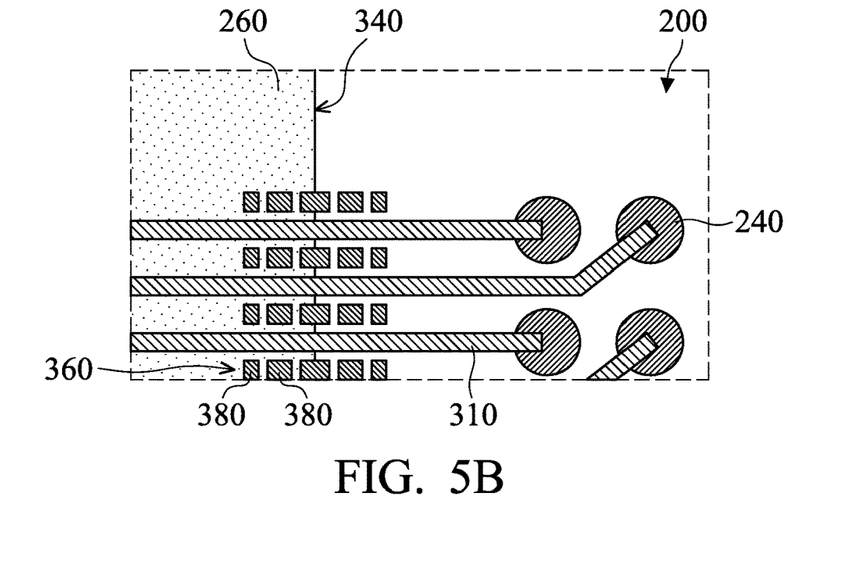
Figure 5C:
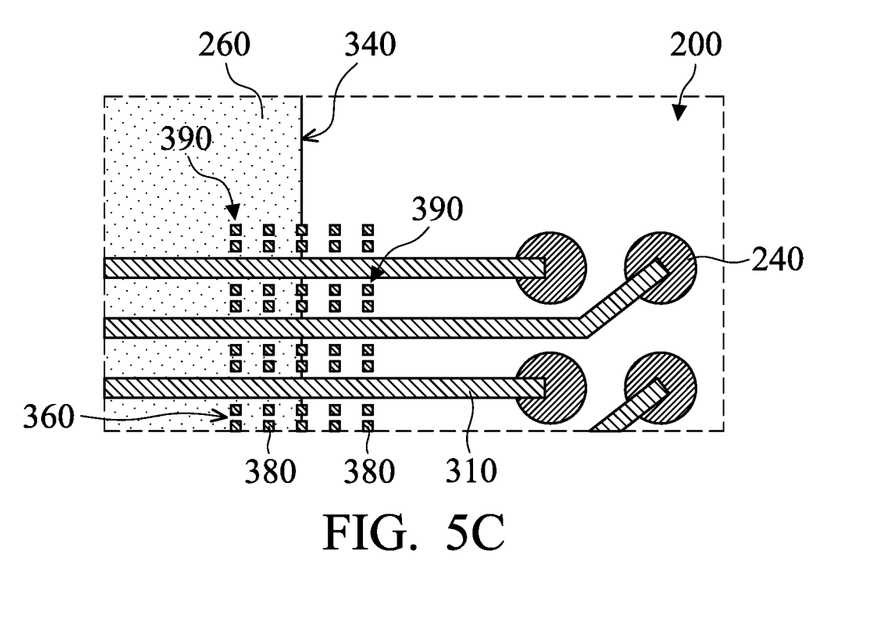

Many variations and/or modifications can be made to embodiments of the disclosure. FIGS. 5A-5C are enlarged top views of a package structure, in accordance with some embodiments. In some embodiments, FIGS. 5A-5C show a portion of the package structure 100 shown in FIG. 1. FIGS. 5A-5C illustrate the active conductive lines 310, the connectors 240 of the integrated circuit dies 200, and the package layer 260 without other features in the package structure 100 for a better understanding of the structure.

As shown in FIG. 5A, there are multiple dummy features 360 between two of the active conductive lines 310, in accordance with some embodiments. In some embodiments, two of the dummy features 360 are connected to each other by a dummy feature 370. The dummy features 360 are continuous lines that are longer than the conductive line 370.

In some embodiments, the conductive line 370 extends across the interface 340, as shown in FIG. 5A. Therefore, stress propagated from the interface 340 into the redistribution structure 300 is diluted even further. In some other embodiments, the conductive line 370 overlaps the integrated circuit dies 200 or the package layer 260 without extending across the interface 340 as viewed from a top view. In some embodiments, the material of the dummy feature 370 is substantially the same as that of the dummy features 360.

Embodiments of the disclosure are not limited thereto. In some other embodiments, there is no dummy feature 370 between the dummy features 360. The dummy features 360 between two of the active conductive lines 310 are isolated from each other.

As shown in FIG. 5B, one or more of the dummy features 360 are discontinuous lines and include multiple discrete dummy segments 380, in accordance with some embodiments. In some embodiments, two of the dummy segments 380 are distributed on two opposite sides of the interface 340. In some embodiments, one of the dummy segments 380 partially overlaps the interface 340.

In some embodiments, the dummy segments 380 are arranged along the active conductive lines 310, as shown in FIG. 5B. In some embodiments, one or more of the active conductive lines 310 are between two of the dummy segments 380. In some embodiments, none of the active conductive lines 310 is between two of the dummy segments 380.

In some embodiments, one of the dummy segments 380 overlapping the interface 340 has a larger area than another of the dummy segments 380 misaligned to the interface 340, as shown in FIG. 5B. Therefore, stress propagated from the interface 340 into the redistribution structure 300 is diluted even further. In some other embodiments, two of the dummy segments 380 have substantially the same area as viewed from a top view. The profile of the dummy segments 380 may include a square shape, a rectangle shape, a circle-like shape, an oval shape, or another suitable shape.

Embodiments of the disclosure are not limited thereto. In some other embodiments, the dummy segments 380 are arranged in one or more arrays 390, as shown in FIG. 5C. In some embodiments, one of the arrays 390 is between two of the active conductive lines 310. In some embodiments, one of the active conductive lines 310 extends between two of the arrays 390.

Many variations and/or modifications can be made to embodiments of the disclosure. For example, although the embodiments shown in FIG. 1 provide a package structure 100 having a "fan-out" feature, embodiments of the disclosure are not limited thereto. Some other embodiments of the disclosure include a package structure having a "fan-in" feature.

Many variations and/or modifications can be made to embodiments of the disclosure. For example, although the embodiments shown in FIG. 1 provide a package on package (PoP) structure, embodiments of the disclosure are not limited thereto. Some other embodiments of the disclosure include a chip on package (CoP) structure or another applicable package structure.

Embodiments of the disclosure provide a package structure. The package structure includes an integrated circuit die embedded in a package layer and a redistribution structure below the integrated circuit die and the package layer. The redistribution structure includes active redistribution lines and a dummy redistribution line. The dummy redistribution line is under an interface between the integrated circuit die and the package layer. As a result, stress propagated from the interface into the redistribution structure is diluted and relieved. Accordingly, damage to the active redistribution lines that may result from stress concentration is prevented. Therefore, reliability of the package structure is significantly enhanced.

According to some embodiments, the disclosure is applied to a package structure including a redistribution structure. The redistribution structure extends across an interface between an integrated circuit die and a package layer as viewed from a top view. Many variations and/or modifications can be made to embodiments of the disclosure. In some other embodiments, the disclosure can be applied to any suitable structure including conductive lines that extends across an interface between features made of different materials.

In accordance with some embodiments, a package structure is provided. The package structure includes an integrated circuit die. The package structure also includes a package layer surrounding the integrated circuit die. There is an interface between the integrated circuit die and the package layer. The package structure further includes a redistribution structure below the integrated circuit die and the package layer. The redistribution structure includes active conductive lines electrically connected to the integrated circuit die. The redistribution structure also includes a dummy conductive line between the active conductive lines. The dummy conductive line extends across the interface.

In accordance with some embodiments, a package structure is provided. The package structure includes an integrated circuit die comprising a semiconductor substrate. The package structure also includes a molding compound in direct contact with a boundary of the semiconductor substrate. The package structure further includes a passivation layer below the integrated circuit die and the molding compound. The passivation layer has a top surface in direct contact with the molding compound. In addition, the package structure includes a first redistribution line in the passivation layer. The first conductive line is electrically connected to the integrated circuit die. The package structure also includes a second redistribution line in the passivation layer. The second redistribution line is electrically connected to the first conductive line. The first conductive line is closer to the top surface of the passivation layer than the second redistribution line. The package structure further includes a dummy feature in the passivation layer. The dummy feature and the first conductive line are at a substantial same level. The dummy feature overlaps the boundary and extends along a direction intersecting the boundary.

In accordance with some embodiments, a package structure is provided. The package structure includes a molding compound. The package structure also includes a semiconductor substrate embedded in the molding compound. There is an interface between the molding compound and the semiconductor substrate. The package structure further includes a passivation layer below the semiconductor substrate and the molding compound. The passivation layer has a top surface in direct contact with the molding compound and has a bottom surface opposite to the top surface. In addition, the package structure includes redistribution lines at different levels in the passivation layer. The top surface of the passivation layer is closer to topmost redistribution lines of the redistribution lines than the bottom surface of the passivation layer. The package structure also includes dummy segments in the passivation layer. The dummy segments and the topmost redistribution lines are at a substantial same level. The dummy segments are under the interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
an integrated circuit die;
a package layer surrounding the integrated circuit die, wherein there is an interface between the integrated circuit die and the package layer;
a passivation layer adjoining the integrated circuit die and the package layer;
a redistribution structure in the passivation layer, wherein the redistribution structure comprises:
first active conductive lines and second active conductive lines below the first active conductive lines electrically connected to the integrated circuit die, wherein the first active conductive lines and the second active conductive lines extend across the interface; and
a dummy conductive feature between the first active conductive lines, wherein the first active conductive lines and the dummy conductive feature are at a substantial same level, and the dummy conductive feature extends across the interface along the first active conductive lines; and
a connector electrically connected to the integrated circuit die through the first active conductive lines and the second active conductive lines, wherein the connector is vertically overlapped with the dummy conductive feature.

2. The package structure as claimed in claim 1, wherein the dummy conductive feature and the package layer sandwich a portion of the passivation layer.

3. The package structure as claimed in claim 1, wherein the dummy conductive feature and the first active conductive lines comprise the same material.

4. The package structure as claimed in claim 1, wherein the dummy conductive feature is a conductive line substantially parallel to the first active conductive lines.

5. The package structure as claimed in claim 1, wherein the redistribution structure further comprises an additional dummy conductive feature physically connected to the dummy conductive feature.

6. The package structure as claimed in claim 1, wherein the dummy conductive feature is shorter than the first active conductive lines.

7. The package structure as claimed in claim 1, wherein the dummy conductive feature has a smaller area than the first active conductive lines.

8. A package structure, comprising:
an integrated circuit die comprising a semiconductor substrate;
a molding compound in direct contact with a boundary of the semiconductor substrate;

a passivation layer below the integrated circuit die and the molding compound, wherein the passivation layer has a top surface in direct contact with the molding compound;

a first redistribution line in the passivation layer, wherein the first redistribution line is electrically connected to the integrated circuit die;

a second redistribution line in the passivation layer, wherein the second redistribution line is electrically connected to the first redistribution line, and the first redistribution line is closer to the top surface of the passivation layer than the second redistribution line;

a third redistribution line in the passivation layer; and a dummy feature in the passivation layer, wherein the dummy feature, and the first redistribution line and the third redistribution are at a substantial same level, and the dummy feature is between the third redistribution line and the first redistribution line, and wherein the dummy feature overlaps the boundary and partially overlaps the second redistribution line and extends along a direction intersecting the boundary.

9. The package structure as claimed in claim 8, wherein the dummy feature has a surface that is substantially coplanar with a surface of the first redistribution line.

10. The package structure as claimed in claim 8, further comprising:

a protection layer between the passivation layer and the semiconductor substrate; and a connector in the protection layer, wherein the connector overlaps the first redistribution line without overlapping the dummy feature.

11. The package structure as claimed in claim 10, wherein the protection layer is embedded in the molding compound and partially overlaps the dummy feature.

12. A package structure, comprising:

a passivation layer;

a first active conductive line at an upper level in the passivation layer;

a second active conductive line at a lower level in the passivation layer;

a dummy conductive feature at the upper level in the passivation layer;

a third active conductive line at the upper level in the passivation layer, wherein the dummy conductive feature is between the third active conductive line and the first active conductive line;

a semiconductor substrate over the passivation layer;

a molding compound covering the passivation layer and surrounding the semiconductor substrate, wherein the dummy conductive feature overlaps the molding compound and the semiconductor substrate;

a protection layer between the passivation layer and the semiconductor substrate; and a connector in the protection layer, wherein the connector overlaps the first active conductive line and the second active conductive line without overlapping the dummy conductive feature.

13. The package structure as claimed in claim 12, wherein the dummy conductive feature at the upper level further overlaps the second active conductive line at the lower level.

14. The package structure as claimed in claim 12, wherein the dummy conductive feature further overlaps an interface between the protection layer and the molding compound.

15. The package structure as claimed in claim 12, further comprising additional dummy conductive features at the upper level in the passivation layer, wherein the additional dummy conductive features are on opposite sides of the dummy conductive feature.

16. The package structure as claimed in claim 15, wherein the dummy conductive feature connects the additional dummy conductive features to each other.

17. The package structure as claimed in claim 15, wherein the additional dummy conductive features extend along a direction intersecting an interface between the molding compound and the semiconductor substrate.

18. The package structure as claimed in claim 12, wherein the dummy conductive feature is separated from the third active conductive line and the first active conductive line by the passivation layer.

19. The package structure as claimed in claim 1, wherein the connector comprises a solder bump or a metal pillar.

20. The package structure as claimed in claim 1, wherein the connector is vertically overlapped with the first active conductive lines and the second active conductive lines.

* * * * *